United States Patent
Brunet et al.

(10) Patent No.: US 8,015,510 B2
(45) Date of Patent: Sep. 6, 2011

(54) INTERCONNECTION MODELING FOR SEMICONDUCTOR FABRICATION PROCESS EFFECTS

(75) Inventors: Jean-Marie Brunet, San Jose, CA (US); William S. Graupp, Aurora, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 438 days.

(21) Appl. No.: 11/707,635

(22) Filed: Feb. 16, 2007

(65) Prior Publication Data
US 2007/0204256 A1 Aug. 30, 2007

Related U.S. Application Data

(60) Provisional application No. 60/774,511, filed on Feb. 17, 2006.

(51) Int. Cl.
*G06F 17/50* (2006.01)
(52) U.S. Cl. ........... 716/13; 716/2; 716/4; 716/5; 716/6; 716/8; 716/11; 716/21
(58) Field of Classification Search ............. 716/2, 4–6, 716/8, 13, 19, 21; 438/16
See application file for complete search history.

(56) References Cited

U.S. PATENT DOCUMENTS

| | | | |
|---|---|---|---|
| 5,610,833 A | | 3/1997 | Chang et al. |
| 6,219,630 B1 | | 4/2001 | Yonezawa et al. |
| 6,562,638 B1 | | 5/2003 | Balasinski et al. |
| 6,578,190 B2 * | | 6/2003 | Ferguson et al. ............... 716/21 |
| 6,841,404 B2 * | 1/2005 | Kawamura et al. ............. 438/16 |
| 6,954,911 B2 * | 10/2005 | Pierrat ............................... 716/4 |
| 7,360,191 B2 * | 4/2008 | Chang et al. ...................... 716/6 |
| 7,383,521 B2 | 6/2008 | Smith et al. |
| 7,451,429 B2 * | 11/2008 | Ikeuchi ........................... 716/19 |
| 7,577,932 B2 | 8/2009 | Brunet et al. |
| 2005/0132306 A1 | 6/2005 | Smith et al. |
| 2005/0251771 A1 * | 11/2005 | Robles .............................. 716/5 |

(Continued)

FOREIGN PATENT DOCUMENTS
WO    WO 2007/100558 A2    9/2007

OTHER PUBLICATIONS

International Preliminary Report on Patentability for PCT/US2007/004414 (published as WO 2007/100558 A2), Aug. 19, 2008, 6 pages.

(Continued)

*Primary Examiner* — Helen Rossoshek
(74) *Attorney, Agent, or Firm* — Klarquist Sparkman, LLP

(57) ABSTRACT

In one embodiment, an interconnect object in a layout of an integrated circuit design to be created with a photolithographic process is determined. The interconnect object includes a width and a length in the layout. A contour generation of the interconnect object in a drawn design is determined based on processing variation factors for the photolithographic process, which produces a generated contour object. A plurality of segments in the generated contour object may be determined based on processing variations. Segments are then broken up based on the processing variations that result. An adjusted width and adjusted length for each of the plurality of segments of the generated contour object are then determined. Resistances and capacitances may be extracted using the adjusted widths and adjusted lengths. Then, the output of the LVS tool may be sent to a SPICE simulation to verify the electrical behavior of the interconnect.

40 Claims, 4 Drawing Sheets

U.S. PATENT DOCUMENTS

| | | | | |
|---|---|---|---|---|
| 2005/0268256 | A1* | 12/2005 | Tsai et al. | 716/4 |
| 2006/0150132 | A1* | 7/2006 | Gupta | 716/5 |
| 2006/0236271 | A1* | 10/2006 | Zach | 716/1 |
| 2006/0265679 | A1* | 11/2006 | Scheffer et al. | 716/8 |
| 2007/0204242 | A1* | 8/2007 | Brunet et al. | 716/2 |
| 2008/0115096 | A1* | 5/2008 | Pikus | 716/4 |
| 2008/0115097 | A1* | 5/2008 | Pikus et al. | 716/5 |
| 2009/0276749 | A1 | 11/2009 | Brunet et al. | |

OTHER PUBLICATIONS

International Search Report for PCT/US2007/004414 (published as WO 2007/100558 A2), Sep. 7, 2008, 3 pages.

* cited by examiner

INTERCONNECTION MODELING FOR SEMICONDUCTOR FABRICATION PROCESS EFFECTS

CROSS REFERENCES TO RELATED APPLICATIONS

This application claims priority from U.S. Provisional Patent Application Ser. No. 60/774,511, entitled CONTOUR DERIVATION FOR LFD AND EXTRACTION, filed on Feb. 17, 2006, which is hereby incorporated by reference as if set forth in full in this application for all purposes.

BACKGROUND

Particular embodiments generally relate to modeling for photolithographic processing and more particularly to contour generation for integrated circuit designs due to process variations.

In a conventional integrated circuit design process, a circuit designer begins with a conceptual idea of what functions an integrated circuit is to perform. The circuit designer then creates a circuit design on a computer and verifies it using one or more simulation tools to ensure that the circuit will operate as desired. The design at this stage may be represented by what is commonly viewed as a circuit schematic, but may also be represented by higher level abstractions within the computer.

These abstract designs are then converted to physical definitions of the circuit elements to be fabricated. These definitions, often called the drawn design of the circuit layout, represent the geometric boundaries for the physical devices to be fabricated—transistor interconnects, capacitors, resistive interconnecting wires, etc. A number of data formats have been created to represent these physical layouts, including Graphic Data System (GDS) II and OASIS™. Often, each physical layer of the circuit has a corresponding data layer to represent the polygonal boundaries of the elements in that layer.

Once the circuit layout has been defined, additional verification checks are performed. Some of these verification checks are to insure that the physical structures will correctly represent the desired electrical behavior. The devices in the layout may be extracted by a tool, such as an LVS, for Layout vs. Schematic or Layout vs. Source tool. Additional extraction of parasitic resistances and capacitances can be done, and the dynamic behavior of the circuit can be estimated for the layout as well. This step is traditionally called parasitic extraction. Then, the electrical behavior of the extracted device may be tested using a simulation tool, such as a Simulation Program with Integrated Circuit Emphasis (SPICE) tool. This is typically referred to as a parametric simulation.

In a parametric simulation, a series of widths and lengths of an interconnect in a circuit layout may be used in a model to simulate the electrical behavior of the interconnect. For example, the layout of an interconnect may be back-annotated using the LVS. The SPICE simulator uses the widths and lengths of the interconnect to verify its electrical behavior in silicon.

Due to process variations, the geometric shapes that are actually manufactured using a photolithographic process may vary from the circuit layout in the drawn design. The widths and lengths of the drawn design for an interconnect may be used to verify the electrical behavior of the interconnect. However, because of the process variations, the widths and lengths from the drawn design may not provide an accurate simulation of the interconnect.

SUMMARY

In one embodiment, an interconnect object in a layout of an integrated circuit design to be created with a photolithographic process is determined. The interconnect object includes a width and a length in the layout. The interconnect design may be in a drawn design in the layout. A contour generation of the interconnect object in the drawn design is determined based on processing variation factors for the photolithographic process, which produces a generated contour. An object that includes the generated contour may be referred to a generated contour object. A plurality of segments in the generated contour object may be determined based on processing variations. For example, contouring of the edges of the interconnect may result clue to processing variations. Segments are then broken up based on the processing variations that result. An adjusted width and adjusted length for each of the plurality of segments of the generated contour object are then determined. The adjusted width and adjusted length may be used by layout verse schematic (LVS) tools to back annotate the layout. For example, resistances and capacitances may be extracted using the adjusted widths and adjusted lengths. Then, the output of the LVS tool may be sent to a SPICE simulation to verify the electrical behavior of the interconnect.

The adjusted lengths and adjusted widths represent the contoured edges that may result due to processing variations. This may result in a more accurate simulation of what actually is manufactured using a photolithographic process. Also, a SPICE simulation may expect to receive multiple resistances and capacitances for an interconnect object. Thus, by providing resistances and capacitances from adjusted widths and adjusted lengths, the simulation methodology does not have to be significantly changed.

A further understanding of the nature and the advantages of particular embodiments disclosed herein may be realized by reference of the remaining portions of the specification and the attached drawings.

DETAILED DESCRIPTION OF EMBODIMENTS

Figure 1A:
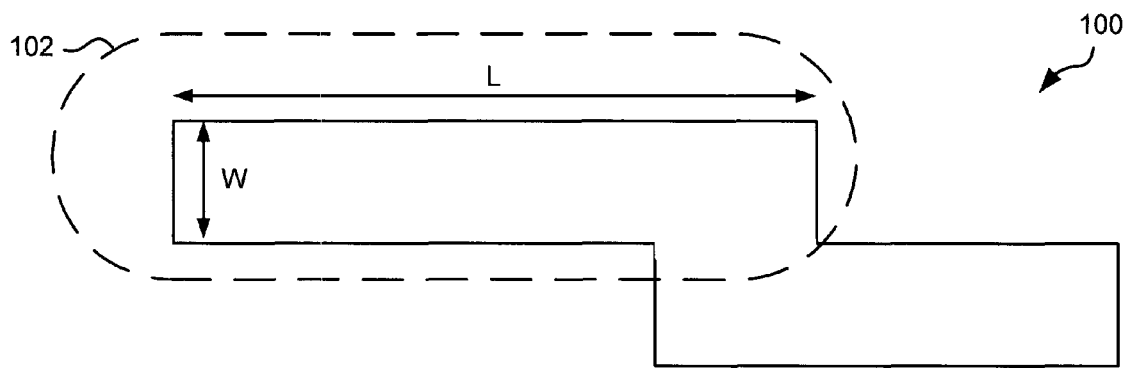
FIG. 1A shows an example of an interconnect design in a layout according to one embodiment.

FIG. 1A shows an example of an interconnect design 100 in a layout according to one embodiment. Interconnect design 100 may be a drawn object that will be created with a photolithographic process. In conventional lithographic processing, a layout for an IC design is stored in a layout format, such as GDS-II or OASIS™, that defines the objects as a number of vertices that in turn define corresponding polygons. The edges of the polygons defined between the vertices can then be further fragmented into additional, smaller edge segments and adapted to ensure the manufacturability of the polygons on a wafer.

FIG. 1A shows a layout that models an interconnect according to one embodiment. An interconnect may be any connecting structure in an integrated circuit design. For example, devices in an integrated circuit may be interconnected using layers of metal. Although this layout is described, it will be understood that other objects in integrated circuit designs may be used. Layouts may also be simulated using particular embodiments described in U.S. patent application Ser. No. 11/707,661, entitled "GATE MODELING FOR SEMICONDUCTOR FABRICATION PROCESS EFFECTS", filed Feb. 16, 2007, which is incorporated by reference in its entirety for all purposes.

As shown in FIG. 1A, a width and length of an object 102 in the layout can be determined. This may be considered the drawn design of the width and length as it does not take into account any process variations that may occur in a photolithography process. The width and length may be for any object in the layout. For example, the object may be any element that captures a design-intent and process condition. Due to process variations, the electrical behavior can be affected if variations occur in electrically sensitive areas of the design (e.g., where there is contextual difference between drawn and generated contour). Accordingly, these areas may be simulated to determine if the process variations will affect the electrical behavior. Although an interconnect is described, it will be understood that other objects may be used in particular embodiments.

Figure 1B:
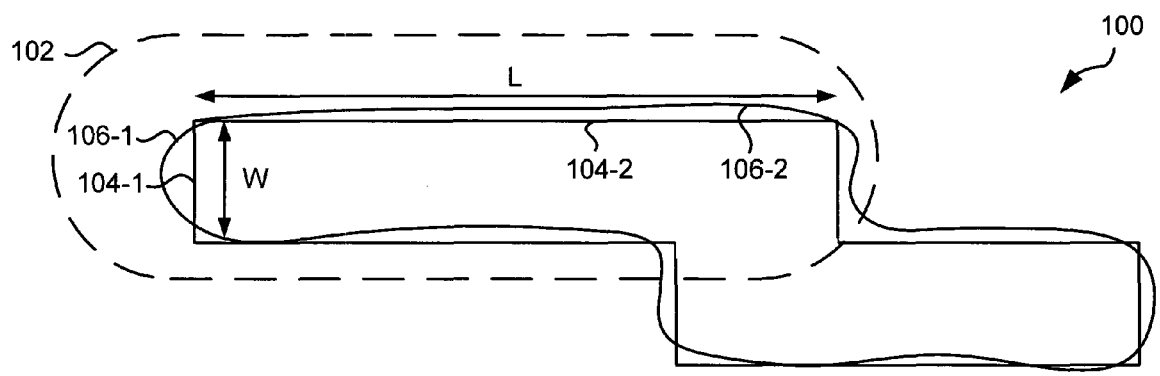
FIG. 1B shows an interconnect design after undergoing a photolithographic process according to one embodiment.

FIG. 1B shows interconnect design 100 modeling for process variations to more accurately predict the shape the interconnect will have after undergoing a photolithographic process according to one embodiment. Object 102 represents a portion of interconnect design 100. The portion of interconnect design is shown for descriptive purposes; it will be understood that any portion (or all of) interconnect design may be included as object 102.

As shown, drawn edges 104-1 and 104-2 represent edges in the drawn design. That is, these edges are the edges in the layout without taking into account any processing variations. Contoured edges 106-1 and 106-2, however, show the contouring that may result after processing variations occur in a photolithographic process. As discussed above, process conditions can vary from wafer to wafer or from chip to chip within a wafer. Examples of process conditions that may vary include, but are not limited to, focus, dose, etch processing, polishing variations, etc. Variations can occur in the focus of the image on the wafer, the dose of illumination light through the mask or reticle, the overlay of the stepper or scanner, the thickness of materials on the wafer, the resist development and processing conditions, as well as other process conditions that affect how the interconnect will be created on the wafer.

In a parametric simulation, the width and length of object 102 in a circuit layout may be used in a model to simulate the electrical behavior of the interconnect. For example, the width and length of the interconnect in the layout may be used to extract resistance and capacitance values using an LVS tool. A SPICE simulator uses the resistance and capacitance values to verify the interconnect's electrical behavior in silicon.

Accordingly, if the width and length of object 102 shown in FIG. 1A is used in a model of a SPICE simulation to verify the electrical behavior of the interconnect, then the simulation may not accurately simulate how the interconnect will electrically behave after undergoing photolithography processing. This is because the width and length of object 102 in FIG. 1A may not accurately represent the contouring of contoured edges 106 that may occur due to processing variations. Thus, the parametric simulation using the width and length of object 102 in FIG. 1A may not be useful. To take into consideration how process variations may affect the objects created on a wafer, particular embodiments determine an adjusted width $W_{adj}$ and adjusted length $L_{adj}$ for multiple segments of the interconnect that model the processing variations that may occur during a photolithographic process.

Figure 2:
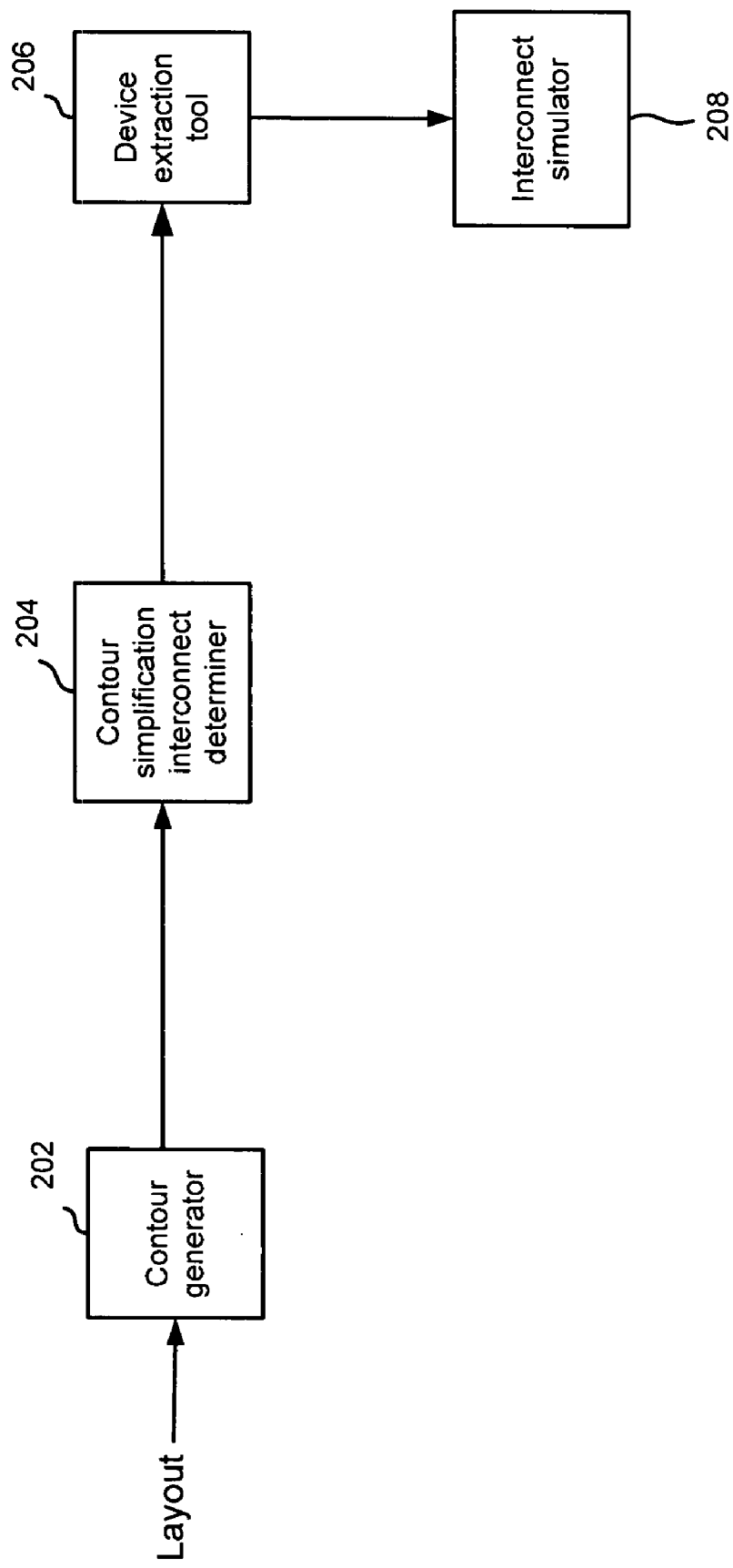
FIG. 2 depicts an example of a system for providing contour-based simulation according to a particular embodiment.

FIG. 2 depicts an example of a system 200 for providing contour-based simulation according to a particular embodiment. As shown, a contour generator 202, a contour simplification interconnect determiner 204, a device extraction tool 206, and an interconnect simulator 208 are provided.

Contour generator 202 is configured to perform a contour generation by simulating process variations that may occur in a lithographic process. Contour generator 202 receives a layout of an integrated circuit design that includes an interconnect. For example, the layout may represent geometric boundaries for physical devices to be fabricated, such as transistor gates, capacitors, resistive-interconnecting wires, etc. Any data format may be used to represent the physical layout, such as GDS-II, OASIS™, etc.

Contour generator 202 uses process variations factors to generate a contour generation of the layout. The process variation factors may be any information that models process variations that may occur in the photolithographic process. As shown in FIG. 1B, a possible contour generation shows contours in the geometric shapes of an interconnect layout that may occur.

Figure 3:
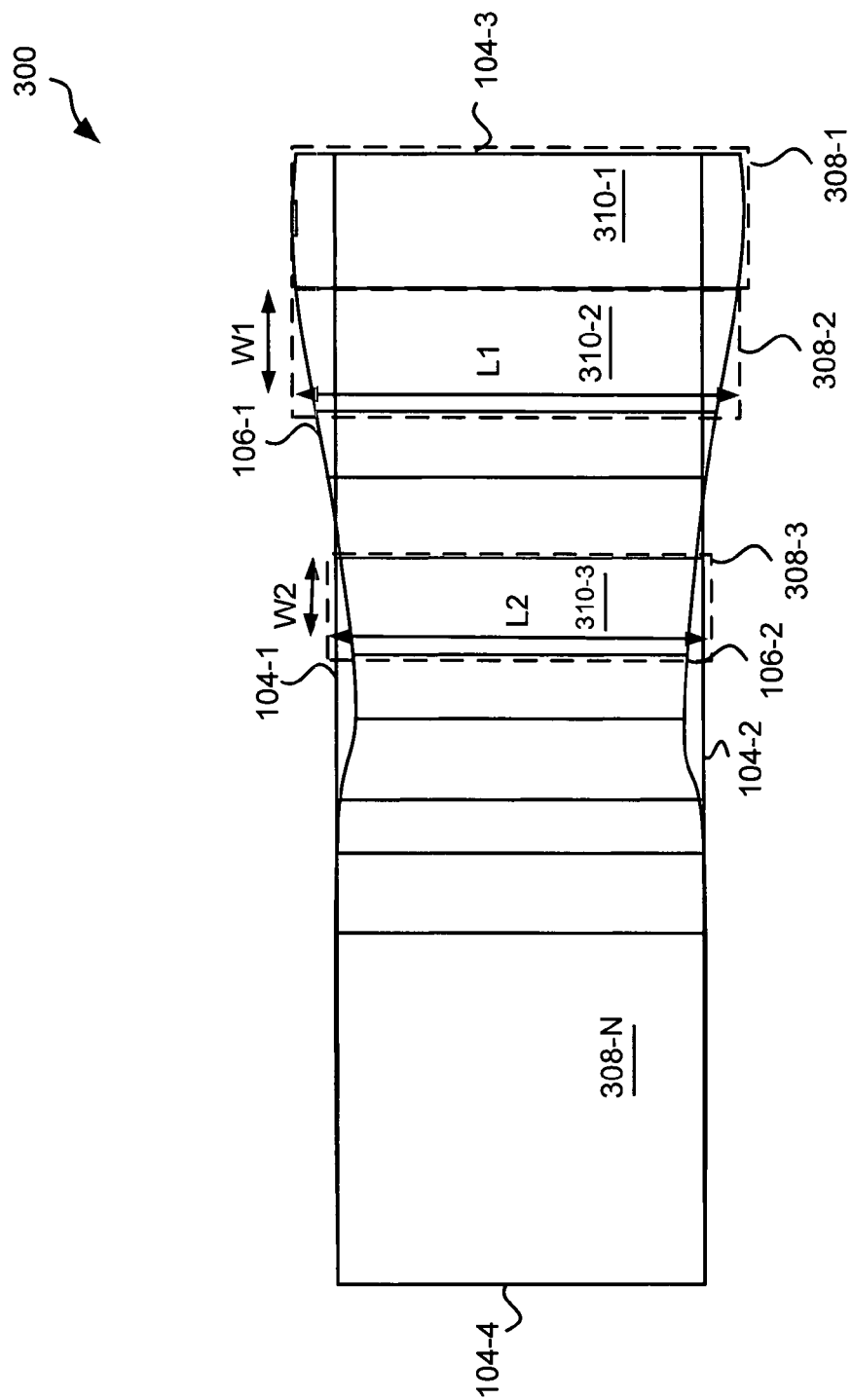
FIG. 3 shows an example of generated contour object used for determining an adjusted length and adjusted width for a plurality of segments according to one embodiment.

The electrical behavior of a portion of the contour simulated layout may be tested. The portion may be referred to as a generated contour object. The contour generation may be an expensive computation. Thus, if it is done full chip, then the cost in time may be exorbitant. Accordingly, in some embodiments, a selective simulation may be determined. For example, a method for determining which areas of an integrated circuit may be tested is provided. These areas of interest may be where variation between the contour and drawn edges may have a good chance to be significantly different due to process variations FIG. 3 shows an example of a generated contour object 300 used for determining an adjusted length and adjusted width for a plurality of segments according to one embodiment. As shown, drawn edges 104-1 and 104-2 represent edges in the drawn design of the interconnect layout. That is, these edges 104-1 and 104-2 are the edges in the layout without taking into account any processing variations. Contoured edges 106-1 and 106-2, however, show the contouring that may result after processing variations factors are represented in a photolithographic process.

Contour simplification interconnect determiner 204 is configured to determine a plurality of segments 308 in a generated contour object 300. Generated contour object 300 may be the object that is defined by contoured edges 106. The breaking up of generated contour object 300 into segments is determined based on the processing variation factors. For example, the segments may be broken based on area changes, slope changes, curvature of contoured edges 106, local maximum/local minimum of contoured edges 106, etc.

In one example, contour simplification interconnect determiner 204 uses area changes to determine how to segment generated contour object 300. For example, an area of a drawn segment 310 using drawn edges may be determined. A contoured segment 308 using contoured edges 306-1 and 306-2 is then determined. Different sized segments may be determined until the area of the contoured segment 308 becomes greater or less than a threshold as compared with the area of a drawn segment 310. A segment break may be determined at that point. In one example, the following equations 1.1 and 1.2 may be used:

$$CS_{area} \leq DS_{area} \cdot (1 + A_{seg}) \qquad (1.1)$$

$$CS_{area} \leq DS_{area} \cdot (1 - A_{seg}) \qquad (1.2)$$

where $0 <= Aseg <= 1$

In equation 1.1, if the contoured segment area ($CS_{area}$) is greater than the drawn segment area ($DS_{area}$) times a variable ($A_{seg}$) set by a user, then the segment is determined at that point. An example of a contoured segment that illustrates an area greater than the drawn segment area times the variable is contoured segment 308-2. In this case, an adjusted length L1 and an adjusted width W1 are used. The adjusted length and width represent the edges of contoured segment 308-2.

In equation 1.2, if the contoured segment area ($CS_{area}$) is less than the drawn segment area ($DS_{area}$) times a variable set by a user, then the segment is determined at that point. An example of a contoured segment that illustrates an area greater than the drawn segment area times the variable is segment 308-3. In this case, an adjusted length L2 and an adjusted width W2 are used. The adjusted length and width represent the edges of contoured segment 308-2.

The adjusted length and adjusted width of contoured segments 308 are the lengths and widths of the dotted rectangles shown. Although the adjusted lengths and adjusted widths using contoured edges 306-2 may not exactly follow the contouring, they may yield more accurate parametric simulations of object 102 because they approximate the contouring. If the processing variations are not taken into account, then the same length and width would be used for object 102 using drawn edges 104. However, contoured segments 308 may vary in size based on the processing variations that are simulated (the deviation of contoured edges 106 from drawn edges 104).

Although using area for breaking generated contour object 300 into segments 308 is described, it will be understood that other methods will be used. For example, the slope of contoured edges 306 may be used. Referring to segment 308-1, the difference between drawn edge 104-1 and contoured edge 106-1 is small. Also, the difference between drawn edge 104-2 and contoured edge 106-2 is also small. When contoured edges 106-1 and 106-2 start to slope inward, then the difference from drawn edges 104-1 and 104-2 becomes larger. Accordingly, a segment is then broken around the point at which the difference starts becomes larger than a desired threshold.

Generated contour object 300 may be segmented more frequently when the deviations from drawn edges 104 become greater. This is because an adjusted width and an adjusted length are determined for the segments 308. If large changes in the contour slope occur, then it may be more accurate to have smaller segments with adjusted widths and lengths rather than a larger segment.

Thus, as shown, a large segment 308-1 is first included where the deviation is not very large between drawn edge 104 and contoured edge 106. However, the segments become smaller as the slope of contoured edges 106 becomes steeper. Then, as the slope becomes less gradual, larger segments, such as segment 308-N, may be determined.

It should be noted that the segments in generated contour object 300 are not arbitrarily determined. For example, fixed-size segments are not just determined. Rather, the processing variations are taken into account to determine the segments. Although this may result in fixed-size segments being determined, the segments are determined based on the processing variations.

Once the adjusted width and adjusted length are determined for each segment, they may be outputted for use in a simulation. For example, the adjusted width and adjusted length may be sent to device extraction tool 206. Also, the adjusted width and adjusted length may be stored, displayed, etc. for other uses.

Devices in the layout may be extracted using device extraction tool 206. A LVS check compares the connectivity and consistency between the logic and the physical objects in the layout. Then, additional extraction of parasitic resistances and capacitors using the adjusted widths and adjusted lengths can also be performed for the interconnect. For example, the adjusted width and adjusted length may be used to determine the resistances and capacitances for each segment of generated contour object 300. The output of device extraction tool 206 is then input into interconnect simulator 208.

Interconnect simulator 208 is configured to perform a parametric simulation to verify the electrical behavior for the interconnect. The parametric simulation may ensure that the physical structures will exhibit the desired electrical behavior. In one embodiment, interconnect simulator 208 is a SPICE simulator that uses models to perform the simulation. The model uses the resistance and capacitance for each segment 308 to perform the parametric simulation. In one embodiment, the simulation receives a series of resistances and capacitances per generated contour object 300. Interconnect simulator 208 outputs a simulation result, which may simulate the electrical behavior of the interconnect. The result may be used to verify the electrical behavior and may be stored, displayed, etc.

For an interconnect that does not take into account process variations, a series of resistances and capacitances are conventionally input into a SPICE simulator. Accordingly, the SPICE simulation methodology does not need to be significantly changed because it is used to receiving a series of resistances and capacitances for an object. However, particular embodiments provide resistances and capacitances that take into account process variations, which yields more accurate simulations.

Figure 4:
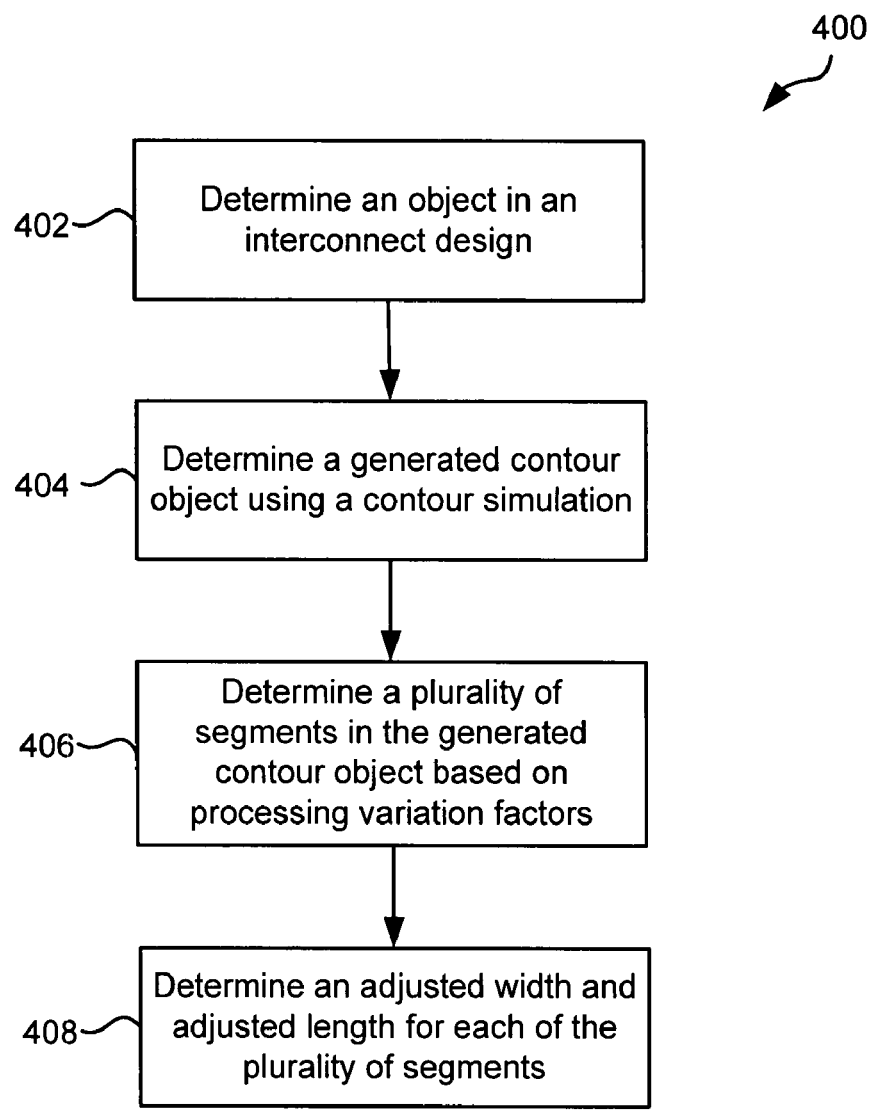
FIG. 4 depicts a simplified flowchart of a method for determining a contour simplification for an interconnect design.

FIG. 4 depicts a simplified flowchart 400 of a method for determining a contour representation for an interconnect design. Step 402 determines an object in an interconnect design. For example, the object may be a portion of an interconnect in a layout.

Step 404 determines a generated contour object 300 using a contour generation. The contour generation determines a generated contour object 300 based on the process variation factors that may occur in a photolithographic process. Generated contour object 300 can be a portion of interconnect design 200 or the entire interconnect design. For example, for ease of simulation, interconnect design may be broken up into portions.

Step 406 determines a plurality of segments 308 in generated contour object 300 based on processing variation factors. For example, plurality of segments 308 may be determined based on area deviation from a drawn design.

Step 408 then determines an adjusted width and adjusted length for each of the plurality of segments. The adjusted width and adjusted length model the width and length of the segment found in generated contour object 300. This takes into account the contoured edges 106 that may result from processing variations. The adjusted width and adjusted length may be used to determine a parametric model for simulation of the object. For example, as described above, generated contour object 300 may be back-annotated using LVS tool 106. The adjusted width and adjusted length may then be used to determine resistances and capacitances for an interconnect model in a parametric simulation.

Accordingly, particular embodiments provide many advantages. For example, a simulation methodology does not need to be significantly changed. A SPICE simulation receives resistances and capacitances that were determined using adjusted lengths and adjusted widths for an interconnect and can use those values to simulate the electrical behavior of the interconnect. This is an efficient process for taking into account processing variation factors in a parametric simulation.

Although the description has been described with respect to particular embodiments thereof, these particular embodiments are merely illustrative, and not restrictive. Although particular embodiments are described with respect to the creation of integrated circuits, it will be appreciated that the techniques of particular embodiments may be applied to any manufacturing process that is subject to process variations. Examples of processes include, but are not limited to, mask bias, overlay errors, film stack thickness variations, mask phase errors, post-exposure bake temperatures, resist development times and post exposure bake times. Other devices fabricated lithographically where particular embodiments may be applied may include Micro-electromechanical systems (MEMS), magnetic heads for disk drives, photonic devices, diffractive optical elements, nanochannels for transporting biological molecules, etc.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time. The sequence of operations described herein can be interrupted, suspended, or otherwise controlled by another process, such as an operating system, kernel, etc. The routines can operate in an operating system environment or as standalone routines occupying all, or a substantial part, of the system processing. Functions can be performed in hardware, software, or a combination of both. Unless otherwise stated, functions may also be performed manually, in whole or in part.

In the description herein, numerous specific details are provided, such as examples of components and/or methods, to provide a thorough understanding of particular embodiments. One skilled in the relevant art will recognize, however, that a particular embodiment can be practiced without one or more of the specific details, or with other apparatus, systems, assemblies, methods, components, materials, parts, and/or the like. In other instances, well-known structures, materials, or operations are not specifically shown or described in detail to avoid obscuring aspects of particular embodiments.

A "computer-readable medium" for purposes of particular embodiments may be any medium that can contain, store, communicate, propagate, or transport the program for use by or in connection with the instruction execution system, apparatus, system, or device. The computer readable medium can be, by way of example only but not by limitation, an electronic, magnetic, optical, electromagnetic, infrared, or semiconductor system, apparatus, system, device, propagation medium, or computer memory.

Particular embodiments can be implemented in the form of control logic in software or hardware or a combination of both. The control logic, when executed by one or more processors, may be operable to perform that what is described in particular embodiments.

A "processor" or "process" includes any human, hardware and/or software system, mechanism or component that processes data, signals, or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems.

Reference throughout this specification to "one embodiment", "an embodiment", "a specific embodiment", or "particular embodiment" means that a particular feature, structure, or characteristic described in connection with the particular embodiment is included in at least one embodiment and not necessarily in all particular embodiments. Thus, respective appearances of the phrases "in a particular embodiment", "in an embodiment", or "in a specific embodiment" in various places throughout this specification are not necessarily referring to the same embodiment. Furthermore, the particular features, structures, or characteristics of any specific embodiment may be combined in any suitable manner with one or more other particular embodiments. It is to be understood that other variations and modifications of the particular embodiments described and illustrated herein are possible in light of the teachings herein and are to be considered as part of the spirit and scope.

Particular embodiments may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated particular embodiments, including what is described in the Abstract, is not intended to be exhaustive or to limit the invention to the precise forms disclosed herein. While specific particular embodiments of, and examples for, the invention are described herein for illustrative purposes only, various equivalent modifications are possible within the spirit and scope, as those skilled in the relevant art will recognize and appreciate. As indicated, these modifications may be made to the present invention in light of the foregoing description of illustrated particular embodiments and are to be included within the spirit and scope.

Thus, while the present invention has been described herein with reference to particular embodiments thereof, a latitude of modification, various changes and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit. It is intended that the invention not be limited to the particular terms used in following claims and/or to the particular embodiment disclosed as the best mode contemplated for carrying out this invention, but that the invention will include any and all particular embodiments and equivalents falling within the scope of the appended claims.

We claim:

1. A method, comprising:
   determining an interconnect object in a layout of a circuit design to be created with a manufacturing process, the interconnect object including one or more drawn edges;
   by a computing device, determining a generated contour object using a contour generation of the interconnect object based on processing variation factors for the manufacturing process, the generated contour object including one or more contoured edges that are contoured based on the processing variation factors;
   determining a plurality of segments in the generated contour object, wherein the dimensions of the segments are determined based on one or more deviations between the drawn edges of the interconnect objects and the contoured edges of the contour object; and
   outputting the plurality of segments.

2. The method of claim 1, wherein the manufacturing process comprises a photolithographic process.

3. The method of claim 1, further comprising performing a simulation of the interconnect object using the outputted plurality of segments.

4. The method of claim 3, further comprising:
   extracting resistances and capacitances for the generated contour object using the the plurality of segments; and
   performing the interconnect simulation using the extracted resistances and capacitances to verify an electrical behavior of the interconnect object.

5. The method of claim 1, wherein the processing variation factors represent contouring of the one or more drawn edges for the interconnect object.

6. The method of claim 1, wherein determining the plurality of segments uses at least one of the following inequalities:

$$CS_{area} \geq DS_{area} \cdot (1+A_{seg}) \text{ or}$$

$$CS_{area} \leq DS_{area} \cdot (1-A_{seg}).$$

7. The method of claim 1, wherein the one or more deviations comprise one or more area deviations between the drawn segments and the contoured segments.

8. The method of claim 1, wherein the determining the plurality of segments comprises using a slope of the one or more contoured edges to determine where to segment the plurality of segments.

9. The method of claim 8, wherein using the slope comprises using a difference between the one or more drawn edges and the one or more contoured edges to determine the plurality of segments.

10. The method of claim 1, wherein the one or more deviations are based on an area deviation between at least a portion of an area defined by the drawn edges of the interconnect objects and at least a portion of an area defined by the contoured edges of the contour object.

11. The method of claim 1, wherein the one or more deviations are based on a slope deviation between a slope of at least one of the drawn edges of the interconnect objects and a slope of at least one of the contoured edges of the contour object.

12. The method of claim 1, further comprising manufacturing a mask or reticle including at least a portion of the layout using the plurality of segments.

13. The method of claim 1, further comprising manufacturing a circuit using a mask or reticle including at least a portion of the layout using the plurality of segments.

14. A computer readable storage memory or storage device storing one or more computer-readable instructions that when executed by a computer cause the computer to perform a method, the method comprising:
   determining an interconnect object in a layout of a circuit design to be created with a manufacturing process, the interconnect object including one or more drawn edges;
   determining a generated contour object using a contour generation of the interconnect object based on processing variation factors for the manufacturing process, the generated contour object including one or more contoured edges that are contoured based on the processing variation factors;
   determining a plurality of segments in the generated contour object, wherein the dimensions of the segments are determined based on one or more deviations between the one or more contoured edges of the generated contour object and the one or more drawn edges of the interconnect object; and
   outputting the plurality of segments.

15. The computer readable memory or storage device of claim 14, wherein the manufacturing process comprises a photolithographic process.

16. The computer readable memory or storage device of claim 14, wherein the method further comprises performing an interconnect simulation of the interconnect object using the outputted plurality of segments.

17. The computer readable memory or storage device of claim 16, wherein the method further comprises:
   extracting resistances and capacitances for the generated contour object using the plurality of segments; and
   verifying an electrical behavior of the interconnect object using results of the interconnect simulation.

18. The computer readable memory or storage device of claim 14, wherein the dimensions of the plurality of segments is determined based at least in part on the processing variation factors.

19. The computer readable memory or storage device of claim 14, wherein the processing variation factors represent contouring of the one or more drawn edges for the interconnect object.

20. The computer readable memory or storage device of claim 14 wherein the defining a plurality of segments further comprises using at least one of the following inequalities:

$$CS_{area} \geq DS_{area} \cdot (1 + A_{seg}) \text{ or}$$

$$CS_{area} \leq DS_{area} \cdot (1 - A_{seg}).$$

21. The computer readable memory or storage device of claim 14, wherein the one or more deviations comprise one or more area deviations between the drawn segments and the contoured segments.

22. The computer readable memory or storage device of claim 14, wherein the one or more deviations are based on an area deviation between at least a portion of an area defined by the drawn edges of the interconnect objects and at least a portion of an area defined by the contoured edges of the contour object.

23. The computer readable memory or storage device of claim 14, wherein the one or more deviations are based on a slope deviation between a slope of at least one of the drawn edges of the interconnect objects and a slope of at least one of the contoured edges of the contour object.

24. A system comprising:
a contour generator configured to:
determine an interconnect object in a layout of a circuit design to be created with a manufacturing process, the interconnect object including one or more drawn edges, and
determine a generated contour object using a contour generation of the interconnect object based on one or more processing variation factors for the manufacturing process, the generated contour object including one or more contoured edges that are contoured based on the processing variation factors; and
a contour interconnect simplification determiner configured to:
determine a plurality of segments in the generated contour object, wherein the dimensions of the plurality of segments are determined based on one or more deviations between the one or more contoured edges of the generated contour object and the one or more drawn edges of the interconnect object, and
store the plurality of segments.

25. The system of claim 24, further comprising a device extraction tool configured to extract resistances and capacitances for the interconnect object using the plurality of segments.

26. The system of claim 24, wherein the device extraction tool comprises a layout vs. schematic tool.

27. The system of claim 24, further comprising a simulator configured to perform a simulation of the interconnect object using the plurality of segments.

28. The system of claim 27, wherein the simulation comprises a SPICE simulation configured to verify electrical behavior of the interconnect object.

29. A method, comprising:
receiving at least one interconnect object that defines at least a portion of a photolithographic design to be created with a manufacturing process, the interconnect object including one or more drawn edges;
using a computer, generating at least one contour object representing the interconnect object, the contour object including one or more contoured edges that are shaped based on applying one or more processing variation factors for the manufacturing process to the interconnect object;
determining a plurality of segments representing the contour object, wherein the dimensions of the segments are determined based at least in part on a deviation between the drawn edges of the interconnect objects and the contoured edges of the contour object; and
outputting the plurality of segments.

30. The method of claim 29, further comprising performing an interconnect simulation of at least a portion of the photolithographic design using the outputted segments.

31. The method of claim 29, further comprising:
performing parasitic extraction on at least a portion of the photolithographic design using the outputted segments, thereby producing parasitic data; and
performing an interconnect simulation of at least a portion of the photolithographic design using the parasitic data.

32. The method of claim 29, wherein the at least one deviation is based on an area deviation between at least a portion of an area defined by the drawn edges of the interconnect objects and at least a portion of an area defined by the contoured edges of the contour object.

33. The method of claim 29, wherein the at least one deviation is based on a slope deviation between a slope of at least one of the drawn edges of the interconnect objects and a slope of at least one of the contoured edges of the contour object.

34. The method of claim 29, further comprising manufacturing a mask or reticle including at least a portion of the layout using the plurality of segments.

35. The method of claim 29, further comprising manufacturing a circuit using a mask or reticle including at least a portion of the layout using the plurality of segments.

36. A computer readable memory or storage device storing one or more computer-readable instructions that when executed be a computer cause the computer to perform a method, the method comprising:
receiving at least one interconnect object that defines at least a portion of a photolithographic design to be created with a manufacturing process, the interconnect object including one or more drawn edges;
generating at least one contour object representing the interconnect object, the contour object including one or more contoured edges that are shaped based on applying one or more processing variation factors for the manufacturing process to the interconnect object;
determining a plurality of segments representing the contour object, wherein the dimensions of the segments are determined based at least in part on a deviation between the drawn edges of the interconnect objects and the contoured edges of the contour object; and
outputting the plurality of segments.

37. The computer readable memory or storage device of claim 36, wherein the method further comprises performing an interconnect simulation of at least a portion of the photolithographic design using the outputted segments.

38. The computer readable memory or storage device of claim 36, wherein the method further comprises:
performing parasitic extraction on at least a portion of the photolithographic design using the outputted segments, thereby producing parasitic data; and
performing an interconnect simulation of at least a portion of the photolithographic design using the parasitic data.

39. The computer readable memory or storage device of claim 36, wherein the at least one deviation is based on an area deviation between at least a portion of an area defined by the drawn edges of the interconnect objects and at least a portion of an area defined by the contoured edges of the contour object.

40. The computer readable memory or storage device of claim 36, wherein the at least one deviation is based on a slope deviation between a slope of at least one of the drawn edges of the interconnect objects and a slope of at least one of the contoured edges of the contour object.

* * * * *